(12) United States Patent
Karlin et al.

(10) Patent No.: US 8,652,865 B2
(45) Date of Patent: Feb. 18, 2014

(54) ATTACHING A MEMS TO A BONDING WAFER

(75) Inventors: Lisa H. Karlin, Chandler, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 177 days.

(21) Appl. No.: 13/210,563

(22) Filed: Aug. 16, 2011

(65) Prior Publication Data

US 2013/0043564 A1    Feb. 21, 2013

(51) Int. Cl.
*H01L 21/00* (2006.01)

(52) U.S. Cl.
USPC .......................................................... 438/51

(58) Field of Classification Search
None
See application file for complete search history.

(56) References Cited

U.S. PATENT DOCUMENTS

| | | | |
|---|---|---|---|
| 4,077,854 A | 3/1978 | Estep et al. | |
| 5,276,955 A | 1/1994 | Noddin et al. | |
| 7,067,397 B1 * | 6/2006 | Chang-Chien et al. | 438/459 |
| 8,058,143 B2 * | 11/2011 | Montez et al. | 438/456 |
| 8,119,431 B2 * | 2/2012 | Park et al. | 438/50 |
| 8,349,635 B1 * | 1/2013 | Gan et al. | 438/50 |
| 2004/0067604 A1 | 4/2004 | Ouellet et al. | |
| 2006/0194361 A1 * | 8/2006 | Heck et al. | 438/48 |
| 2009/0194861 A1 * | 8/2009 | Bonse et al. | 257/690 |
| 2010/0059835 A1 * | 3/2010 | Martin et al. | 257/417 |
| 2010/0181676 A1 * | 7/2010 | Montez et al. | 257/771 |

\* cited by examiner

*Primary Examiner* — Benjamin Sandvik
(74) *Attorney, Agent, or Firm* — James L. Clingan, Jr.

(57) ABSTRACT

A MEMS is attached to a bonding wafer in part by forming a support layer over the MEMS. A first eutectic layer is formed over the support layer. The eutectic layer is patterned into segments to relieve stress. A second eutectic layer is formed over the bonding wafer. A eutectic bond is formed with the segments and the second eutectic layer to attach the bonding wafer to the MEMS.

5 Claims, 1 Drawing Sheet

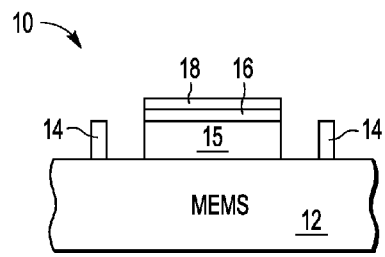
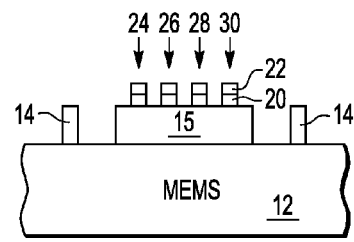
FIG. 1     FIG. 2
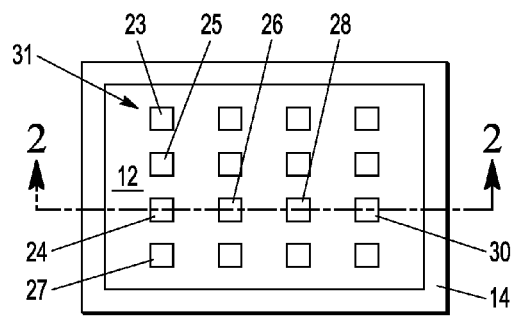
FIG. 3
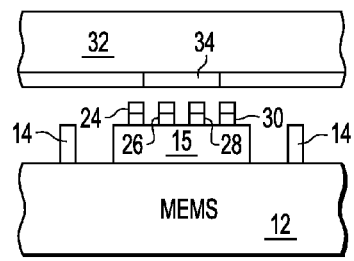
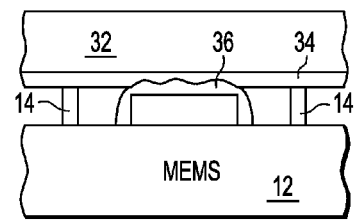
FIG. 4     FIG. 5

ATTACHING A MEMS TO A BONDING WAFER

BACKGROUND

1. Field

This disclosure relates generally to micro electro-mechanical systems (MEMS), and more specifically, to forming a MEMS to bonding wafer contact.

2. Related Art

Micro electro-mechanical systems (MEMS) have become increasing important in functioning as transducers. One example is accelerometers in which an acceleration is detected first by movement within a MEMS which in turn is converted to a change in an electrical characteristic such as capacitance. This change in capacitance is converted to an electrical signal that provides a measure of acceleration. This electrical signal can have a variety of uses one of which is to activate an air bag. This type of use can be critical so it is important that it function properly. Because there is movement within the MEMS, the movable structure must have integrity. Accordingly, stresses relating to the movable structure and those related to it must not be so severe as to result in a failure of the movable structure.

Accordingly, there is a need to improve upon managing stress in the manufacture of MEMS.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a MEMS device in a stage in processing according to an embodiment;

FIG. 2 is a cross section of the MEMS device of FIG. 1 at a subsequent stage in processing;

FIG. 3 is a top view of the MEMS device of FIG. 2;

FIG. 4 is a cross section of the MEMS device of FIG. 2 and a bonding wafer prior to forming eutectic bond between the MEMS device and the bonding wafer; and FIG. 5 is a cross section of the MEMS device of FIG. 2 and a bonding wafer after forming the eutectic bond.

DETAILED DESCRIPTION

In one aspect, a MEMS device has a contact formed on it. The contact has an adhesion layer, which may be a polysilicon layer, on the MEMS device and a first eutectic layer, which may be a silicon germanium layer, on the adhesion layer. The first eutectic layer is patterned to reduce the stress created from forming the first eutectic layer. A bonding wafer has a eutectic-bond-forming layer which is a second eutectic layer that is of a material, or materials in the case of eutectic-bond-forming layer being more than one layer, that is a eutectic pair with the material of the first eutectic layer. The eutectic-bond-forming layer is applied to the first eutectic layer with pressure and heat to form a eutectic bond between the bonding wafer and the MEMS device. This is better understood by reference to the drawings and the following description.

Shown in FIG. 1 is a MEMS 12, a polysilicon gap stop 14 on MEMS 12, a polysilicon layer 15 on MEMS 12 and spaced from and within polysilicon gap stop 14, a graded silicon germanium layer 16 on polysilicon layer 15, and a silicon germanium layer 18 on graded silicon germanium layer 16. Graded silicon germanium layer 16 begins with a very low concentration of germanium and increases in germanium concentration until a final concentration of germanium is reached. Silicon germanium layer 18 has a continuous germanium concentration which is the same germanium concentration as the final germanium concentration of graded silicon germanium layer 16. The germanium grading is to improve adhesion between the ultimate silicon germanium contact portion, silicon germanium layer 18. In some situations grading of the germanium may not be needed. Also, instead of gradual grading, a silicon germanium layer of continuous concentration but lower concentration than the germanium concentration of silicon germanium layer 18 may be used. This combination of silicon and germanium is particularly effective because there is good adhesion between silicon and germanium forms an effective eutectic bond with aluminum. Other materials, however, may be found to be effective. Germanium could be used over a different material than silicon that provides sufficient adhesion. Similarly a different material that provides an effective eutectic bond with a subsequently applied conductive material may be used. Copper and tin, for example, can form an effective eutectic bond as can gold and silicon. Thus, it may be considered that germanium is a eutectic material in that it can form a eutectic bond with certain other materials, for example aluminum. The subsequently applied material, conductive in this example, that forms a eutectic bond may also be considered a eutectic material. Germanium and aluminum may be considered a eutectic pair in that when these two are in contact under pressure and heat they form a eutectic bond between them.

Shown in FIG. 2 is MEMS 12 after graded silicon germanium layer 16 and silicon germanium layer 18 have been etched into a checkerboard pattern. As shown in FIG. 2 there are segments 24, 26, 28, and 30 that are part of the pattern. Segment 30 is representative of the other segments such as segments 24, 26, and 28, by showing a top portion 22 that is a portion of silicon germanium layer 18 and a portion 20 that is a portion of graded silicon germanium layer 16.

Shown in FIG. 3 is a top view of MEMS 12 of FIG. 2 showing a pattern 31 as the checkerboard pattern. Line 2-2 shows where the cross section of FIG. 2 is taken. In this example there are four rows and four columns of segments that make up pattern 31. One row is made up of segments 24, 26, 28, and 30. One of the columns is made up of segments 23, 25, 24, and 27. By forming pattern 31, stress generated by graded silicon germanium layer 16 and silicon germanium layer 18 is relieved. The stress generated by graded silicon germanium layer 16 and silicon germanium layer 18 is very significant and can be passed to MEMS 12 and subsequent damage MEMS 12. Pattern 31 may be considered a checkerboard pattern. The segments are shown as squares but they could much more rounded than shown and would still be considered a checkerboard pattern.

Shown in FIG. 4 is MEMS 12 with segments 24, 26, 28, and 30 of pattern 31 and a bonding wafer 32 having a eutectic-bond-forming bonding layer 34, conductive in this example but not necessarily so, on bonding wafer 32. Bonding wafer 32 may include an integrated circuit that is for being connected to MEMS 12. In FIG. 4, MEMS 12 and bonding wafer 32 are in position just prior to forming a eutectic bond between eutectic-bond-forming layer 34 and pattern 31.

Shown in FIG. 5 is MEMS 12 and bonding wafer 32 after having been pressed together with pressure and heat to form a eutectic bond 36 between pattern 31 and conductive layer 34. Polysilicon gap stop 14 ensures that eutectic bond 36 is contained.

Thus, by adding a pattern to graded silicon germanium layer 16 and silicon germanium layer 18, stress is relieved while still forming an effective eutectic bond between the bonding wafer and the MEMS.

By now it should be appreciated that there has been provided a method of attaching a MEMS to a bonding wafer. The method includes forming a first eutectic layer of a first material over the MEMS. The method further includes patterning the first eutectic layer into a checkerboard pattern. The method further includes forming second eutectic layer of a second material over the bonding wafer wherein the first material and the second material are a eutectic pair. The method further includes applying heat and pressure in contacting the first eutectic layer and the second eutectic layer to form a eutectic bond between the MEMS and the bonding wafer. The method may have a further characterization by which the first material comprises silicon germanium. The method may have a further characterization by which the second material comprises aluminum. The method may further include forming an adhesion layer on the MEMS prior to forming the first eutectic layer, wherein the first eutectic layer is formed on the adhesion layer. The method may have a further characterization by which forming an adhesion layer on the MEMS prior to forming the first eutectic layer, wherein the first eutectic layer is formed on the adhesion layer. The method may have a further characterization by which the adhesion layer comprises a silicon layer. The method may have a further characterization by which the adhesion layer further comprises a silicon germanium layer, wherein the silicon germanium layer is on the silicon layer and the second silicon germanium layer has an average germanium concentration less than that of the first material. The method may have a further characterization by which the silicon germanium layer has a graded concentration of germanium. The method may have a further characterization by which the graded concentration is characterized by having a higher concentration of germanium at an interface with the first eutectic layer than at an interface with the silicon layer. The method may have a further characterization by which the first material and the second material comprise a silicon and gold eutectic pair. The method may have a further characterization by which the first material and the second material comprise a copper and tin eutectic pair. The method may have a further characterization by which the patterning comprises performing an etch of silicon germanium. The method may have a further characterization by which the checkerboard pattern comprises rows and columns of segments of the first eutectic layer.

Also described is a method of attaching a MEMS to bonding wafer. The method includes forming a support layer over the MEMS. The method further includes forming over the support layer a first eutectic layer. The method further includes patterning the eutectic layer into segments to relieve stress. The method further includes forming over the bonding wafer a second eutectic layer. The method further includes forming a eutectic bond with the segments and the second eutectic layer to attach the MEMS to the bonding wafer. The method may have a further characterization by which the step of patterning forms the segments into rows and columns. The method may have a further characterization by which the step of patterning results in the segments forming a checkerboard pattern. The method may have a further characterization by which the segments are in the form of squares. The method may further comprise forming an adhesion layer between the support layer and the first eutectic layer. The method may have a further characterization by which the support layer comprises silicon, the first eutectic layer comprises silicon germanium, and the second eutectic layer comprises aluminum.

Described also is a MEMS prepared for attaching to a bonding wafer having a eutectic-bond-forming layer. The MEMS device includes a a support layer over the MEMS and a plurality of segments over the support layer for attaching to the bonding wafer. The the plurality of segments are in intersecting rows and columns. The the plurality of segments are of a first material that is a eutectic pair with the eutectic-bond-forming layer. The MEMS may have a further characterization by which the segments comprise silicon germanium.

Although the invention is described herein with reference to specific embodiments, various modifications and changes can be made without departing from the scope of the present invention as set forth in the claims below. For example, a different materials than those described may be found to be effective for forming the eutectic bond. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of attaching a MEMS to a bonding wafer, comprising:
    forming an adhesion layer on the MEMS, wherein the adhesion layer comprises a silicon layer and a first silicon germanium layer on the silicon layer;
    forming a forming a first eutectic layer comprising a second silicon germanium layer on the silicon germanium layer and over the MEMS, wherein the first silicon germanium layer has an average germanium concentration less than an average germanium concentration of the second silicon germanium layer;
    patterning the first eutectic layer into a checkerboard pattern;
    forming second eutectic layer comprising aluminum over the bonding wafer wherein the first material and the second material are a eutectic pair; and
    applying heat and pressure in contacting the first eutectic layer and the second eutectic layer to form a eutectic bond between the MEMS and the bonding wafer.

2. The method of claim 1, wherein the first silicon germanium layer has a graded concentration of germanium.

3. The method of claim 2, wherein the graded concentration is characterized by having a higher concentration of germanium at an interface with the first eutectic layer than at an interface with the silicon layer.

4. The method of claim 1, wherein the patterning comprises performing an etch of silicon germanium.

5. The method of claim 1, wherein the checkerboard pattern comprises rows and columns of segments of the first eutectic layer.

* * * * *

UNITED STATES PATENT AND TRADEMARK OFFICE
CERTIFICATE OF CORRECTION

| | | |
|---|---|---|
| PATENT NO. | : 8,652,865 B2 | Page 1 of 1 |
| APPLICATION NO. | : 13/210563 | |
| DATED | : February 18, 2014 | |
| INVENTOR(S) | : Karlin et al. | |

It is certified that error appears in the above-identified patent and that said Letters Patent is hereby corrected as shown below:

In the Claims

Column 4, Line 46, Claim 1, please change "forming a forming a" to be --forming a--

Signed and Sealed this
Twenty-second Day of July, 2014

Michelle K. Lee
*Deputy Director of the United States Patent and Trademark Office*